(12) United States Patent
Lee et al.

(10) Patent No.: US 10,854,829 B2
(45) Date of Patent: Dec. 1, 2020

(54) FLEXIBLE DISPLAY DEVICE

(71) Applicant: Samsung Display Co., Ltd., Yongin-si (KR)

(72) Inventors: Eun Ho Lee, Suwon-si (KR); Dong Wook Yang, Suwon-si (KR); Hyun Dae Lee, Yongin-si (KR); Woo Seok Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 88 days.

(21) Appl. No.: 16/103,845

(22) Filed: Aug. 14, 2018

(65) Prior Publication Data
US 2019/0140200 A1    May 9, 2019

(30) Foreign Application Priority Data
Nov. 6, 2017 (KR) ......................... 10-2017-0146772

(51) Int. Cl.
*H01L 51/00* (2006.01)
*H01L 27/32* (2006.01)

(52) U.S. Cl.
CPC ...... *H01L 51/0097* (2013.01); *H01L 27/3276* (2013.01)

(58) Field of Classification Search
None
See application file for complete search history.

(56) References Cited

U.S. PATENT DOCUMENTS

| 9,693,422 | B2 | 6/2017 | Park et al. |
| 9,693,452 | B2 | 6/2017 | Konvisser et al. |
| 2017/0317299 | A1* | 11/2017 | Choi .................. H01L 27/3262 |

* cited by examiner

*Primary Examiner* — Moazzam Hossain
*Assistant Examiner* — Stanetta D Isaac
(74) *Attorney, Agent, or Firm* — Lewis Roca Rothgerber Christie LLP

(57) ABSTRACT

A flexible display device includes: a substrate including a main area, a first edge area arranged in a first direction with respect to the main area and including a first data pad portion, and a second edge area arranged in a second direction, which intersects the first direction, with respect to the main area and including a second data pad portion; and a flexible film on which first and second signal pad portions connected to the first and second data pad portions, respectively, are arranged. The first edge area may be bent along a first bending line, which extends in the second direction, and the second edge area may be bent along a second bending line, which extends in the first direction.

20 Claims, 13 Drawing Sheets

FLEXIBLE DISPLAY DEVICE

CROSS-REFERENCE TO RELATED APPLICATION

This application claims priority to and the benefit of Korean Patent Application No. 10-2017-0146772, filed on Nov. 6, 2017 in the Korean Intellectual Property Office, the entire content of which is incorporated by reference herein.

BACKGROUND

1. Field

Aspects of embodiments of the present disclosure relate to a flexible display device.

2. Description of the Related Art

Display devices have become increasingly important in accordance with developments in multimedia technology. Accordingly, various types of display devices, such as a liquid crystal display (LCD) device, an organic light-emitting display device, etc., have been used.

The organic light-emitting display device displays an image using light-emitting diodes (OLEDs), which generate light through the recombination of electrons and holes. The organic light-emitting display device has many advantages, such as fast response speed, high luminance, wide viewing angle, and low power consumption.

SUMMARY

According to aspects of exemplary embodiments of the present disclosure, a flexible display device has display portions disposed even in edge areas thereof and is capable of reducing a number of signal lines in the edge areas.

However, aspects of exemplary embodiments of the present disclosure are not limited to those set forth herein. The above and other aspects of exemplary embodiments of the present disclosure will become more apparent to one of ordinary skill in the art to which the present disclosure pertains by referencing the detailed description of some exemplary embodiments of the present disclosure provided herein.

According to one or more exemplary embodiments of the present invention, a flexible display device comprises: a substrate including a main area, a first edge area arranged in a first direction with respect to the main area, a first data pad portion being arranged in the first edge area, and a second edge area arranged in a second direction, which intersects the first direction, with respect to the main area, a second data pad portion being arranged in the second edge area; and a flexible film on which first and second signal pad portions connected to the first and second data pad portions, respectively, are arranged, and the first edge area is bent along a first bending line, which extends in the second direction, and the second edge area is bent along a second bending line, which extends in the first direction.

According to one or more exemplary embodiments of the present invention, a flexible display device comprises: a substrate including a main area in which a first pixel unit is arranged, a first edge area arranged in a first direction with respect to the main area, a second pixel unit and a first data pad portion being arranged in the first edge area, and a second edge area arranged in a second direction, which intersects the first direction, with respect to the main area, a third pixel unit and a second data pad portion being arranged in the second edge area, and the first edge area is bent along a first bending line, which extends in the second direction, the second edge area is bent along a second bending line, which extends in the first direction, the third pixel unit includes a first switching element connected to a first data line arranged in the second edge area, and the first data line is connected to the second data pad portion.

According to an aspect of the aforementioned and other exemplary embodiments of the present disclosure, a number of signal lines in edge areas of a flexible display device where display portions are disposed can be reduced.

Other features and aspects of exemplary embodiments may be apparent from the following detailed description, the drawings, and the claims.

BRIEF DESCRIPTION OF THE DRAWINGS

The above and other exemplary embodiments and features of the present disclosure will become more apparent by describing in further detail some exemplary embodiments thereof with reference to the attached drawings, in which.

DETAILED DESCRIPTION

Figure 1:
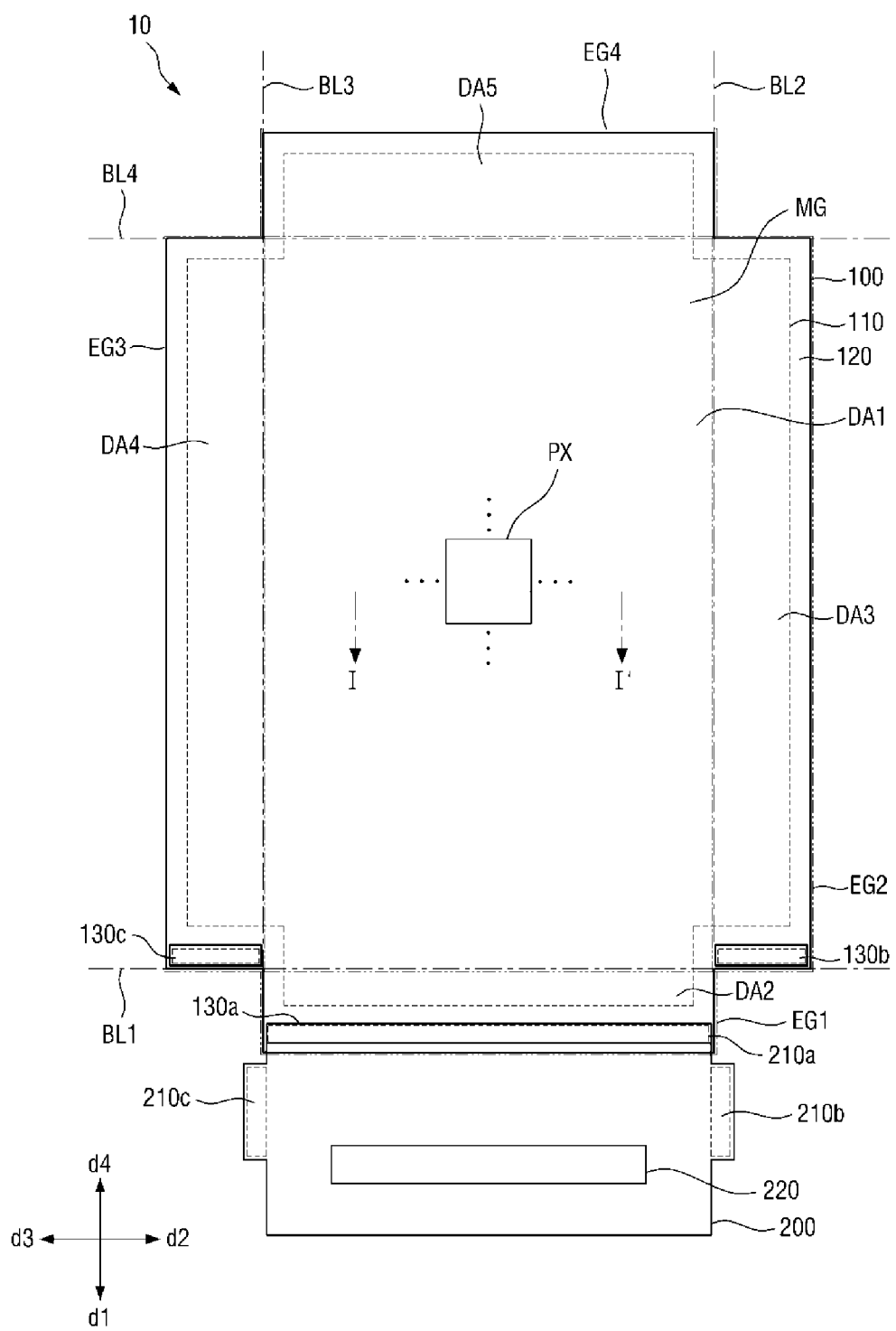
FIG. 1 is a plan view of a flexible display device according to an exemplary embodiment of the present disclosure.

In the following description, for the purposes of explanation, numerous details are set forth in order to provide a thorough understanding of various exemplary embodiments. It is apparent, however, that various exemplary embodiments may be practiced without these specific details or with one or more equivalent arrangements. In other instances, well-known structures and devices may be shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or one or more intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a "first" element, component, region, layer, and/or section discussed below could be termed a "second" element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments may be described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings may be schematic in nature and their shapes not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and are not to be interpreted in an idealized or overly formal sense, unless expressly so defined herein.

Herein, some exemplary embodiments will be described with reference to the accompanying drawings.

Figure 2:
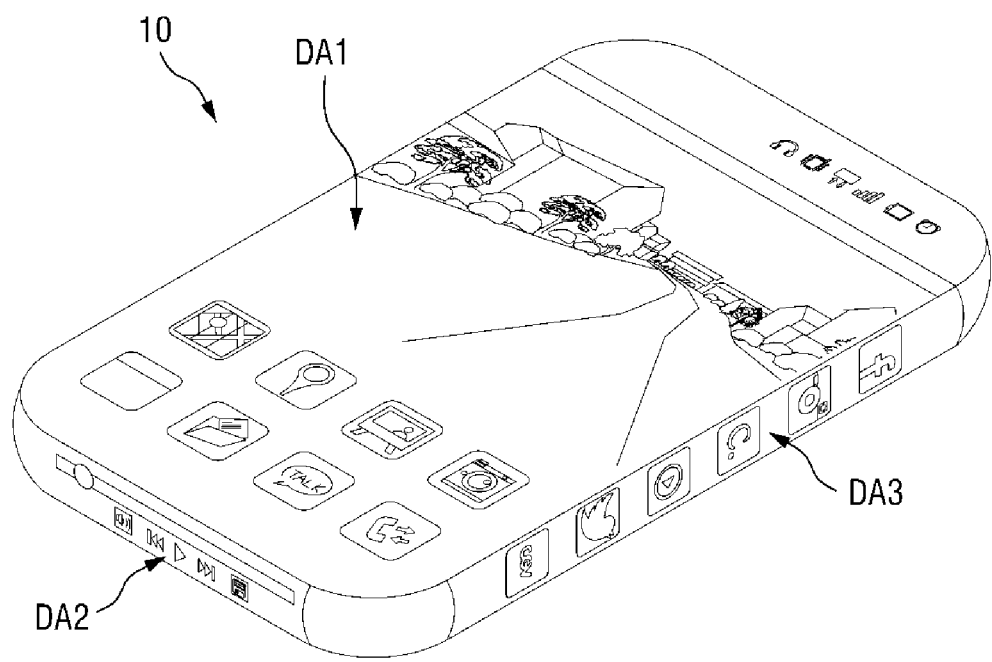
FIG. 2 is a perspective view of a flexible display device according to an exemplary embodiment of the present disclosure.

FIG. 1 is a plan view of a flexible display device according to an exemplary embodiment of the present disclosure; and FIG. 2 is a perspective view of a flexible display device according to an exemplary embodiment of the present disclosure.

Referring to FIG. 1, a flexible display device 10 may include a substrate 100, which has a display area 110 and a non-display area 120, and a flexible film 200, on which a driver integrated circuit (IC) 220 is disposed.

The flexible display device 10 may display an image in various states, such as an unfolded state, a bent state, or a cylindrically rolled state. In an exemplary embodiment, the flexible display device 10 may be an organic light-emitting display device, but the present disclosure is not limited thereto. In another exemplary embodiment, the flexible display device 10 may be a field emission display device, a liquid crystal display (LCD) device, or an electronic paper display device. In the description that follows, the flexible display device 10 is described, for example, as an organic light-emitting display device.

The substrate 100 and elements disposed on the substrate 100 will be described further below.

The substrate 100 may be an insulating substrate. In an exemplary embodiment, the substrate 100 may comprise a material such as glass, quartz, or a polymer resin. The polymer resin may be polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

The substrate 100 may be divided into the display area 110 and the non-display area 120.

The display area 110 is defined as an area in which an image is displayed. In the display area 110, first through fifth display portions DA1 through DA5 may be disposed, and each of the first through fifth display portions DA1 through DA5 includes a plurality of pixel units PX, which are for displaying an image. The non-display area 120 is defined as an area in which an image is not displayed. Signal lines for providing signals for displaying an image in the display area 110 and power lines for supplying power may be disposed in the non-display area 120.

The substrate 100 may also be divided into a main area MG and first through fourth edge areas EG1 through EG4.

The main area MG is defined as a flat central area. As used herein, the term "flat" means that no tensile or compressive force is generated with respect to the substrate 100. The main area MG is not bent along first through fourth bending lines BL1 through BL4. The main area MG overlaps with the first display portion DA1.

The first through fourth edge areas EG1 through EG4 are defined as areas bent or bendable at a curvature (e.g., a predetermined curvature) toward the rear of the main area MG along the first through fourth bending lines BL1 through BL4. The curvature of the first through fourth edge areas EG1 through EG4 may be uniform or may gradually increase or decrease.

In order for the flexible display device 10 to display an image on the sides thereof, the second through fifth display portions DA2 through DA5 may be disposed in the first through fourth edge areas EG1 through EG4, respectively.

The first edge area EG1 is disposed in a first direction d1 with respect to the main area MG. The first edge area EG1 is bent toward the rear of the main area MG along the first bending line BL1. The second display portion DA2, which extends from the first display area DA1, may be disposed in the first edge area EG1. The second edge area EG2 is disposed in a second direction d2 with respect to the main area MG. The second edge area EG2 is bent toward the rear of the main area MG along the second bending line BL2. The third display portion DA3, which extends from the first display portion DA1, may be disposed in the second edge area EG2.

The third edge area EG3 is disposed in a third direction d3 with respect to the main area MG. The third edge area EG3 is bent toward the rear of the main area MG along the third bending line BL3. The fourth display portion DA4, which extends from the first display area DA1, may be disposed in the third edge area EG3. The fourth edge area EG4 is disposed in a fourth direction d4 with respect to the main area MG. The fourth edge area EG4 is bent toward the rear of the main area MG along the fourth bending line BL4. The fifth display portion DA5, which extends from the first display portion DA1, may be disposed in the fourth edge area EG4.

In an exemplary embodiment, the second through fifth display portions DA2 through DA5 may be bent at a curvature (e.g., a predefined curvature). That is, the second through fifth display portions DA2 through DA5 may be bent together with the first through fourth edge areas EG1 through EG4, respectively. Alternatively, the second through fifth display portions DA2 through DA5 may be formed to be flat, in which case, areas that are bent at a curvature (e.g., a predetermined curvature) may be provided between the first display portion DA1 and the second through fifth display portions DA2 through DA5.

In an exemplary embodiment, the first display portion DA1 may have a rectangular shape, but the shape is not particularly limited to that illustrated in FIG. 1. For example, the first display portion DA1 may be formed to have a shape that is approximately rectangular in consideration of processing conditions. In another exemplary embodiment, the first display portion DA1 may have a shape with rounded corners, and the rounded corners of the first display portion DA1 may be formed by at least partially cutting off the substrate 100 using a laser, for example.

In an exemplary embodiment, the second through fifth display portions DA2 through DA5 may have a rectangular shape, but the shape is not particularly limited to that illustrated in FIG. 1. For example, the second through fifth display portions DA2 through DA5 may be formed to have a shape that is approximately rectangular in consideration of processing conditions. Also, unlike those shown in FIG. 1, the second and third display portions DA2 and DA3, and/or the fourth and fifth display portions DA4 and DA5, may have different shapes.

First through third data pad portions 130a through 130c may be further disposed in the non-display area 120 of the substrate 100. In an embodiment, the first data pad portion 130a may be disposed in the first edge area EG1, the second pad portion 130b may be disposed in the second edge area EG2, and the third data pad portion 130c may be disposed in the third edge area EG3.

The first through third data pad portions 130a through 130c may be electrically connected to a plurality of signal lines, which are connected to the pixel units PX in the first through fifth display portions DA1 through DA5. The first through third data pad portions 130a through 130c may also be electrically connected to a scan driver 140 (see FIG. 8), which provides a plurality of scan signals to the pixel units PX. The connections between, and the flow of signals between, the first through third data pad portions 130a through 130c, a plurality of signal lines, and the scan driver 140 will be described later with reference to FIG. 8.

The flexible film 200 may be coupled to an end of the substrate 100. The flexible film 200 may provide the first through third data pad portions 130a through 130c with signals to be provided to the plurality of signal lines and the scan driver 140.

The flexible film 200 may have flexibility. The flexible film 200 may be bent to conform to the bent shape of the substrate 100. In an embodiment, the flexible film 200 may be connected to the first data pad portion 130a, which is disposed in the first edge area EG1, the second data pad portion 130b, which is disposed in the second edge area EG2, and the third data pad portion 130c, which is disposed in the third edge area EG3. That is, the flexible film 200 may be coupled to the substrate 100 in the first through third edge areas EG1 through EG3.

First through third signal pad portions 210a through 210c may be formed on the flexible film 200. The driver IC 220 may also be formed on the flexible film 200. Signal lines for connecting the driver IC 220 and the first through third signal pad portions 210a through 210c may also be formed on the flexible film 200. In an embodiment, the driver IC 220 may be mounted on the flexible film 200 in the form of a chip-on-film (COF).

The first signal pad portion 210a may be placed in contact with the first data pad portion 130a, which is disposed in the first edge area EG1, the second signal pad portion 210b may be placed in contact with the second data pad portion 130b, which is disposed in the second edge area EG2, and the third signal pad portion 210c may be placed in contact with the third data pad portion 130c, which is disposed in the third edge area EG3. As a result, the first through third signal pad portions 210a through 210c may provide signals provided from the driver IC 220 to the first through third data pad portions 130a through 130c.

The bent shape of the flexible film 200 is not particularly limited as long as the first through third signal pad portions 210a through 210c can be placed in contact with the first through third data pad portions 130a through 130c, respectively. The bent shape of the flexible film 200 will be described further later with reference to FIGS. 5A through 7B.

The flexible display device 10 can display an image not only in the first display portion DA1, which is disposed in the main area MG, but also in the second through fifth display portions DA2 through DA5, which are disposed in the first through fourth edge areas EG1 through EG4, respectively.

In an embodiment, referring to FIG. 2, the first display portion DA1 provides an image to a user in a forward direction, and the second through fifth display portions DA2 through DA5 may provide an image to the user in lateral directions. FIG. 2 illustrates an example in which the first, second, and third display portions DA1, DA2, and DA3 provide images.

In an exemplary embodiment, the second through fifth display portions DA2 through DA5 may be formed to extend from the first display portion DA1. In another exemplary embodiment, the second through fifth display portions DA2 through DA5 may be formed to be separate or spaced apart from the first display portion DA1. In a case in which the second through fifth display portions DA2 through DA5 are formed to be separate or spaced apart from the first display portion DA1, areas where no image is displayed may be disposed between the first display portion DA1 and the second through fifth display portions DA2 through DA5.

In an embodiment, the first through fifth display portions DA1 through DA5 may be driven independently of one another. For example, the first display portion DA1 may display an image, and the second and third display portions DA2 and DA3 may not display an image. In an embodiment, at least a part of each of the second and third display portions DA2 and DA3 may display an image.

The pixel units PX, which are disposed in the first through fifth display portions DA1 through DA5, will be described with reference to FIG. 3.

Figure 3:
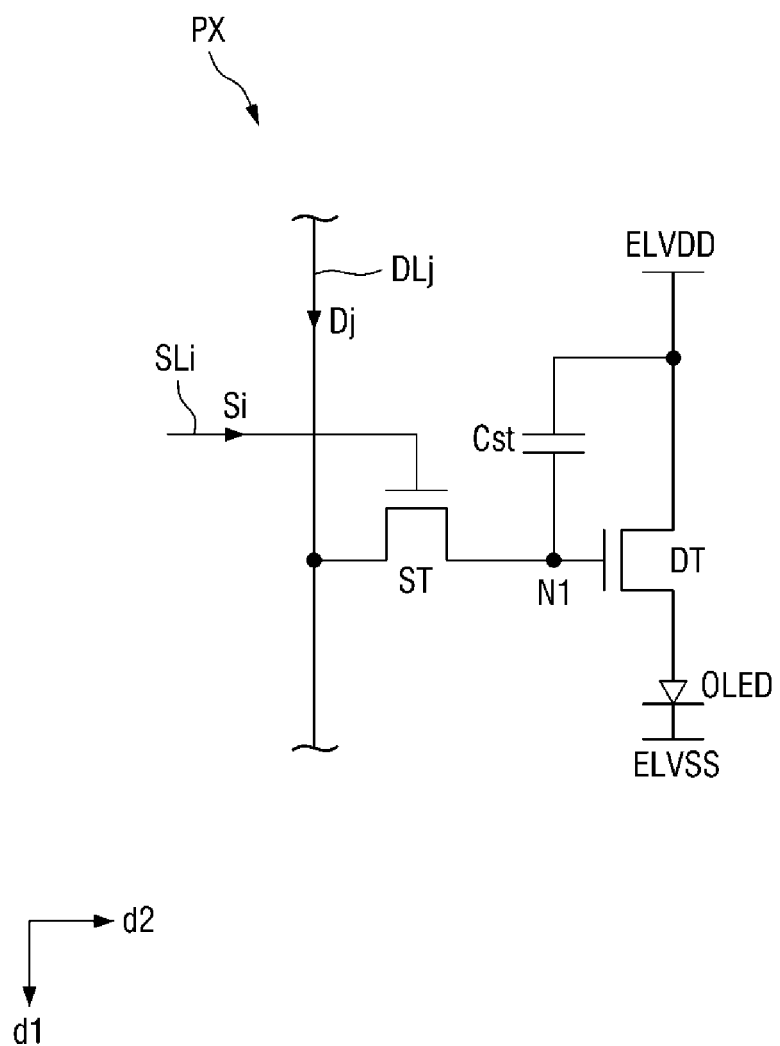
FIG. 3 is an equivalent circuit diagram of a pixel unit illustrated in FIG. 1.

FIG. 3 is an equivalent circuit diagram of a pixel unit illustrated in FIG. 1.

FIG. 3 illustrates a pixel unit PX electrically connected to the driver IC 220 via a j-th data line DLj (where j is a natural number not smaller than 1) and electrically connected to the scan driver 140 (see FIG. 8) via an i-th scan line SLi (where i is a natural number not smaller than 1).

Referring to FIG. 3, the pixel unit PX may include a scan transistor ST, a driving transistor DT, a storage capacitor Cst, and an organic light-emitting diode OLED.

The scan transistor ST may include a source electrode electrically connected to the j-th data line DLj, which extends in the first direction d1, a gate electrode electrically connected to the i-th scan line SLi, which extends in the second direction d2, and a drain electrode electrically connected to a first node N1. The scan transistor ST may perform a switching operation in accordance with an i-th scan signal Si provided from the i-th scan line SLi and may thus provide a j-th data signal Dj provided from the j-th data line DLj to the first node N1.

The driving transistor DT may include a gate electrode electrically connected to the first node N1, a source electrode provided with a first driving voltage ELVDD, and a drain electrode connected to a first electrode of the organic light-emitting diode OLED. A second electrode of the organic light-emitting diode OLED is provided with a second driving voltage ELVSS. The first and second driving voltages ELVDD and ELVSS may be direct current (DC) voltages, and the second driving voltage ELVSS may be lower than the first driving voltage ELVDD.

The driving transistor DT may perform a switching operation in accordance with the j-th data signal Dj and may thus control the amount of driving current that flows to the organic light-emitting diode OLED.

The storage capacitor Cst may include a first electrode electrically connected to the first node N1 and a second electrode provided with the first driving voltage ELVDD. The storage capacitor Cst may be charged with a voltage corresponding to the difference between the voltage provided to the first node N1 and the first driving voltage ELVDD.

The elements disposed on the substrate 100, particularly, the driving transistor DT of each of the pixel units PX, will be described with reference to FIG. 4.

Figure 4:
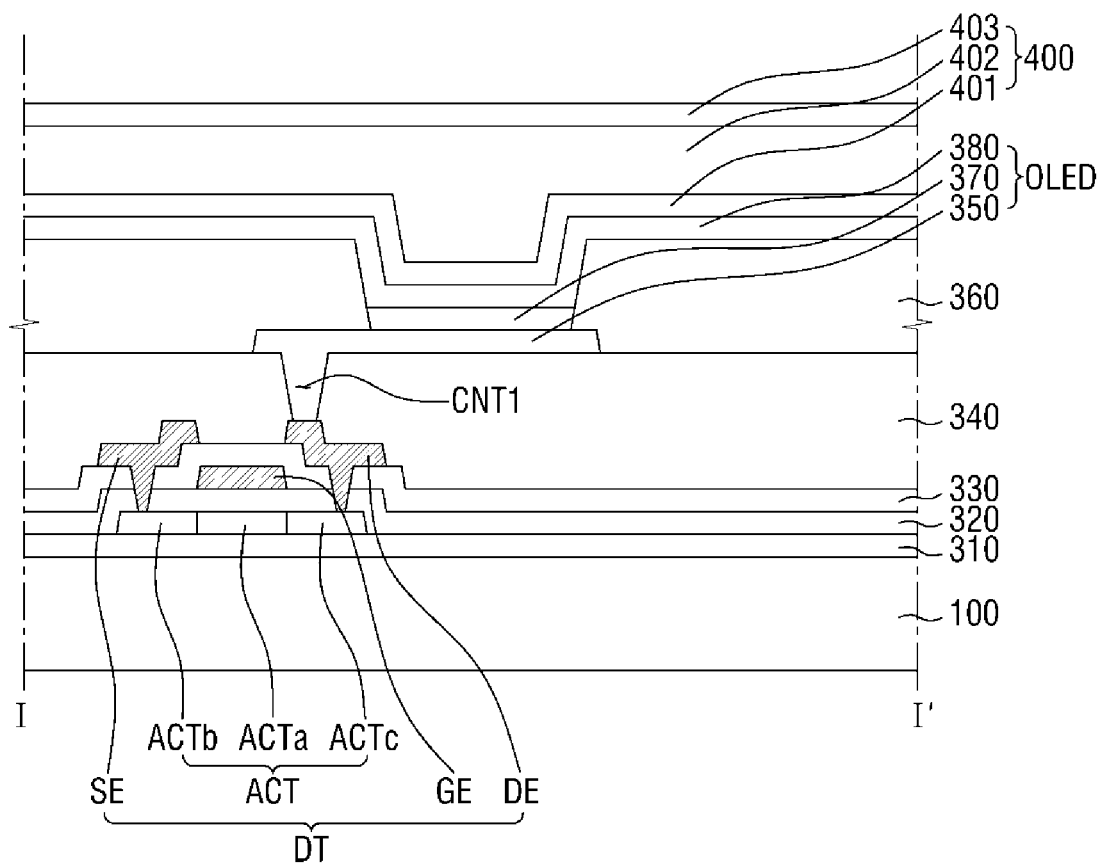
FIG. 4 is a cross-sectional view taken along the line I-I' of FIG. 1.

FIG. 4 is a cross-sectional view taken along the line I-I' of FIG. 1.

Referring to FIG. 4, a buffer layer 310 may be disposed on the substrate 100. The buffer layer 310 may prevent or substantially prevent infiltration of moisture and oxygen from the outside through the substrate 100. Also, the buffer layer 310 may planarize the surface of the substrate 100. In an exemplary embodiment, the buffer layer 310 may include one of a silicon nitride (SiNx) film, a silicon oxide (SiO$_2$) film, and a silicon oxynitride (SiOxNy) film. However, the buffer layer 310 may not be provided, depending on the type of the substrate 100 or processing conditions, for example.

A semiconductor layer including a semiconductor pattern ACT may be disposed on the buffer layer 310. The semiconductor layer, particularly, the semiconductor pattern ACT, will be described. In an exemplary embodiment, the semiconductor pattern ACT may be formed by mixing one or two selected from among polycrystalline silicon, monocrystalline silicon, low-temperature polycrystalline silicon, amorphous silicon, and an oxide semiconductor. In an exemplary embodiment, the semiconductor pattern ACT may include a channel region ACTa, which is not doped with impurities, and a source region ACTb and a drain region ACTc, which are doped with impurities. The source region ACTb is located on one side of the channel region ACTa and is electrically connected to a source electrode SE that will be described later. The drain region ACTc is located on the other side of the channel region ACTa and is electrically connected to a drain electrode DE that will be described later.

A first insulating layer 320 may be disposed on the semiconductor layer including the semiconductor pattern ACT. In an exemplary embodiment, the first insulating layer 320 may be a gate insulating layer. The first insulating layer 320 may be formed by mixing at least one selected from the group consisting of an inorganic insulating material, such as silicon oxide (SiOx) or silicon nitride (SiNx), and an organic insulating material, such as benzocyclobutene (BCB), an acrylic material, or PI.

A gate conductor comprising a gate electrode GE may be disposed on the first insulating layer 320. The gate electrode GE is the gate electrode of the driving transistor DT of FIG. 3. The gate conductor may also include the i-th scan line SLi of FIG. 3. The gate electrode GE may extend from the i-th scan line SLi and may overlap with the semiconductor pattern ACT. The gate conductor may comprise, for example, an aluminum (Al)-based metal including an Al alloy, a silver (Ag)-based metal including an Ag alloy, a copper (Cu)-based metal including a Cu alloy, a molybdenum (Mo)-based metal including a Mo alloy, chromium (Cr), titanium (Ti), or tantalum (Ta).

A second insulating layer 330 may be disposed on the gate conductor including the gate electrode GE. In an embodiment, the second insulating layer 330 may be formed by mixing at least one selected from the group consisting of an inorganic insulating material, such as SiOx or SiNx, and an organic insulating material, such as BCB, an acrylic material, or PI.

A data conductor including the source electrode SE and the drain electrode DE may be disposed on the second insulating layer 330. The source electrode SE is the source electrode of the driving transistor DT of FIG. 3. The drain electrode DE is the drain electrode of the driving transistor DT of FIG. 3.

The data conductor not only includes the j-th data line DLj of FIG. 3, but also includes driving voltage lines for providing the first and second driving voltages ELVDD and ELVSS of FIG. 3. The source electrode SE and the drain electrode DE are disposed on the second insulating layer 330 to be spaced apart from each other. The data conductor may comprise at least one selected from the group consisting of a metal, an alloy, a metal nitride, a conductive metal oxide, and a transparent conductive material. In an exemplary embodiment, the data conductor may have a single- or multi-layer structure comprising nickel (Ni), cobalt (Co), Ti, Ag, Cu, Mo, Al, beryllium (Be), niobium (Nb), gold (Au), iron (Fe), selenium (Se), or Ta. An alloy obtained by adding at least one selected from the group consisting of Ti, zirconium (Zr), tungsten (W), Ta, Nb, platinum (Pt), hafnium (Hf), oxygen (O), and nitrogen (N) to a metal may also be used as the material of the source electrode SE and the drain electrode DE.

The semiconductor pattern ACT, the gate electrode GE, the source electrode SE, and the drain electrode DE may form the driving transistor DT of FIG. 3.

A planarization layer 340 may be disposed on the data conductor. The planarization layer 340 can eliminate or reduce height differences and can thus improve the light emission efficiency of a pixel electrode 350 and an organic light-emitting layer 370 that will be described later. In an exemplary embodiment, the planarization layer 340 may comprise an organic material. For example, the planarization layer 340 may comprise at least one selected from among PI, polyacryl, and polysiloxane. In another exemplary embodiment, the planarization layer 340 may comprise an inorganic material or the combination of an inorganic material and an organic material. A first contact hole CNT1, which at least partially exposes the drain electrode DE, may be formed in the planarization layer 340.

The pixel electrode 350 may be disposed on the planarization layer 340. The pixel electrode 350 may be electrically connected to a part of the drain electrode DE exposed by the first contact hole CNT1. The pixel electrode 350 may be an anode electrode, which is a hole injection electrode. In a case in which the pixel electrode 350 is an anode electrode, the pixel electrode 350 may comprise a material with a high work function so as to be able to facilitate the injection of holes. Also, the pixel electrode 350 may be a reflective electrode, a transflective electrode, or a transmissive electrode. In an exemplary embodiment, the pixel electrode 350 may comprise a reflective material. The reflective material may be, for example, at least one selected from the group consisting of Ag, magnesium (Mg), Cr, Au, Pt, Ni, Cu, W, Al, aluminum-lithium (Al—Li), magnesium-indium (Mg—In), and magnesium-silver (Mg—Ag).

In an exemplary embodiment, the pixel electrode 350 may be formed as a single film, but the present disclosure is not limited thereto. That is, in an embodiment, the pixel electrode 350 may be formed as a multilayer film having a stack of two or more materials.

In an exemplary embodiment, in a case in which the pixel electrode 350 is formed as a multilayer film, the pixel electrode 350 may include a reflective film and a transparent or transflective electrode disposed above the reflective film. In another exemplary embodiment, the pixel electrode 350 may include a reflective film and a transparent or transflective electrode disposed below the reflective film. For example, the pixel electrode 350 may have a triple-layer structure of indium tin oxide (ITO)/Ag/ITO, but the present disclosure is not limited thereto.

The transparent or transflective electrode of the pixel electrode 350 may comprise at least one selected from the group consisting of ITO, indium zinc oxide (IZO), zinc oxide (ZnO), indium oxide ($In_2O_3$), indium gallium oxide (IGO), and aluminum zinc oxide (AZO).

A pixel defining layer 360 may be disposed on the pixel electrode 350. The pixel defining layer 360 includes an opening, which at least partially exposes the pixel electrode 350. The pixel defining layer 360 may comprise an organic material or an inorganic material. In an exemplary embodiment, the pixel defining layer 360 may comprise a material such as photoresist, a PI resin, an acrylic resin, a silicon compound, or a polyacrylic resin.

The organic light-emitting layer 370 may be disposed on the pixel electrode 350 and the pixel defining layer 360. The organic light-emitting layer 370 may be disposed on a part of the pixel electrode 350 exposed by the opening of the pixel defining layer 360. In an exemplary embodiment, the organic light-emitting layer 370 may at least partially cover the sidewalls of the pixel defining layer 360.

In an exemplary embodiment, the organic light-emitting layer 370 may emit one of red light, blue light, and green light. In another exemplary embodiment, the organic light-emitting layer 370 may emit white light or may emit one of cyan light, magenta light, and yellow light. In a case in which the organic light-emitting layer 370 emits white light, the organic light-emitting layer 370 may comprise a white-light-emitting material or may have a stack of a red-light-emitting layer, a green-light-emitting layer, and a blue-light-emitting layer.

A common electrode 380 may be disposed on the organic light-emitting layer 370 and the pixel defining film 360. In an exemplary embodiment, the common electrode 380 may be formed on the entire surface of the substrate 100 where the organic light-emitting layer 370 and the pixel defining film 360 are formed. In an exemplary embodiment, the common electrode 380 may be a cathode electrode. In an exemplary embodiment, the common electrode 380 may comprise at least one selected from the group consisting of lithium (Li), calcium (Ca), LiF/Ca, LiF/Al, Al, Ag, and Mg. Also, the common electrode 380 may be formed of a material with a low work function. In an exemplary embodiment, the common electrode 380 may be a transparent or transflective electrode comprising at least one selected from the group consisting of ITO, IZO, ZnO, $In_2O_3$, IGO, and AZO.

The pixel electrode 350, the organic light-emitting layer 370, and the common electrode 380 may form the organic light-emitting diode OLED, but the present disclosure is not limited thereto. For example, alternatively, the organic light-emitting diode OLED may have a multilayer structure and may further include a hole injection layer (HIL), a hole transport layer (HTL), an electron transport layer (ETL), and an electron injection layer (EIL).

An encapsulation layer 400 may be disposed to face the substrate 100 and may cover the organic light-emitting diode OLED. The encapsulation layer 400 may prevent or substantially prevent moisture and air from the outside from infiltrating into the organic light-emitting diode OLED. In an exemplary embodiment, the encapsulation layer 400 may include a first inorganic layer 401, an organic layer 402, and a second inorganic layer 403.

The first inorganic layer 401 may be disposed on the common electrode 380. In an embodiment, the first inorganic layer 401 may comprise at least one selected from the group consisting of SiOx, SiNx, and SiONx.

The organic layer 402 may be disposed on the first inorganic layer 401. In an embodiment, the organic layer 402 may comprise one selected from the group consisting of epoxy, acrylate, and urethane acrylate. The organic layer 402 may planarize a height difference formed by the pixel defining layer 360.

The second inorganic layer 403 may be disposed on the organic layer 402. In an embodiment, the second inorganic layer 403 may comprise one selected from the group consisting of SiOx, SiNx, and SiONx.

The first inorganic layer 401, the organic layer 402, and the second inorganic layer 403 are illustrated in FIG. 4 as each having a single-layer structure, but the present disclosure is not limited thereto. That is, at least one of the first inorganic layer 401, the organic layer 402, and the second inorganic layer 403 may be formed to have a multilayer structure.

In another exemplary embodiment, the encapsulation layer 400 may include a hexamethyldisiloxane (HMDSO) layer. In an embodiment, the encapsulation layer 400 may include the first inorganic layer 401, the second inorganic layer 403, and the HMDSO layer disposed between the first and second inorganic layers 401 and 403. That is, the organic layer 402 may be replaced with the HMDSO layer.

In an exemplary embodiment, the HMDSO layer may be formed in the same chamber as the first inorganic layer 401 after the formation of the first inorganic layer 401. In this manner, the formation of the encapsulation layer 400 can be simplified. Also, since the HMDSO layer capable of absorbing stress may be included in the encapsulation layer 400, the encapsulation layer 400 may have sufficient flexibility.

In another exemplary embodiment, the encapsulation layer 400 may be a transparent insulating substrate. In an embodiment, the transparent insulating substrate may be a glass substrate, a quartz substrate, or a transparent resin substrate. In a case in which the encapsulation layer 400 is a transparent insulating substrate, the encapsulation layer 400 may be coupled to the substrate 100 via an additional sealing member.

Although not specifically illustrated, at least one of a polarizing layer, an input sensing layer, and a window layer may be disposed on the encapsulation layer 400.

The polarizing layer may reduce the reflectance of external light incident thereupon from the outside. In an exemplary embodiment, the polarizing layer may include a retarder and a polarizer. However, the polarizing layer may not be provided. In a case in which the polarizing layer is not provided, a black matrix and a color filter may be disposed on the encapsulation layer 400 in order to address color separation that may be caused by the reflection of external light.

In an exemplary embodiment, the input sensing layer may be formed directly on the encapsulation layer 400. In another exemplary embodiment, the input sensing layer may be coupled to the encapsulation layer 400 via an additional adhesive member.

It will be described how the substrate 100 and the flexible film 200 are coupled to each other with reference to FIGS. 5 through 7, and any redundant descriptions of the elements that have already been described above with reference to FIGS. 1 through 4 may be omitted.

First, a bent shape of the substrate 100 will be described with reference to FIGS. 5A and 5B.

Figure 5A:
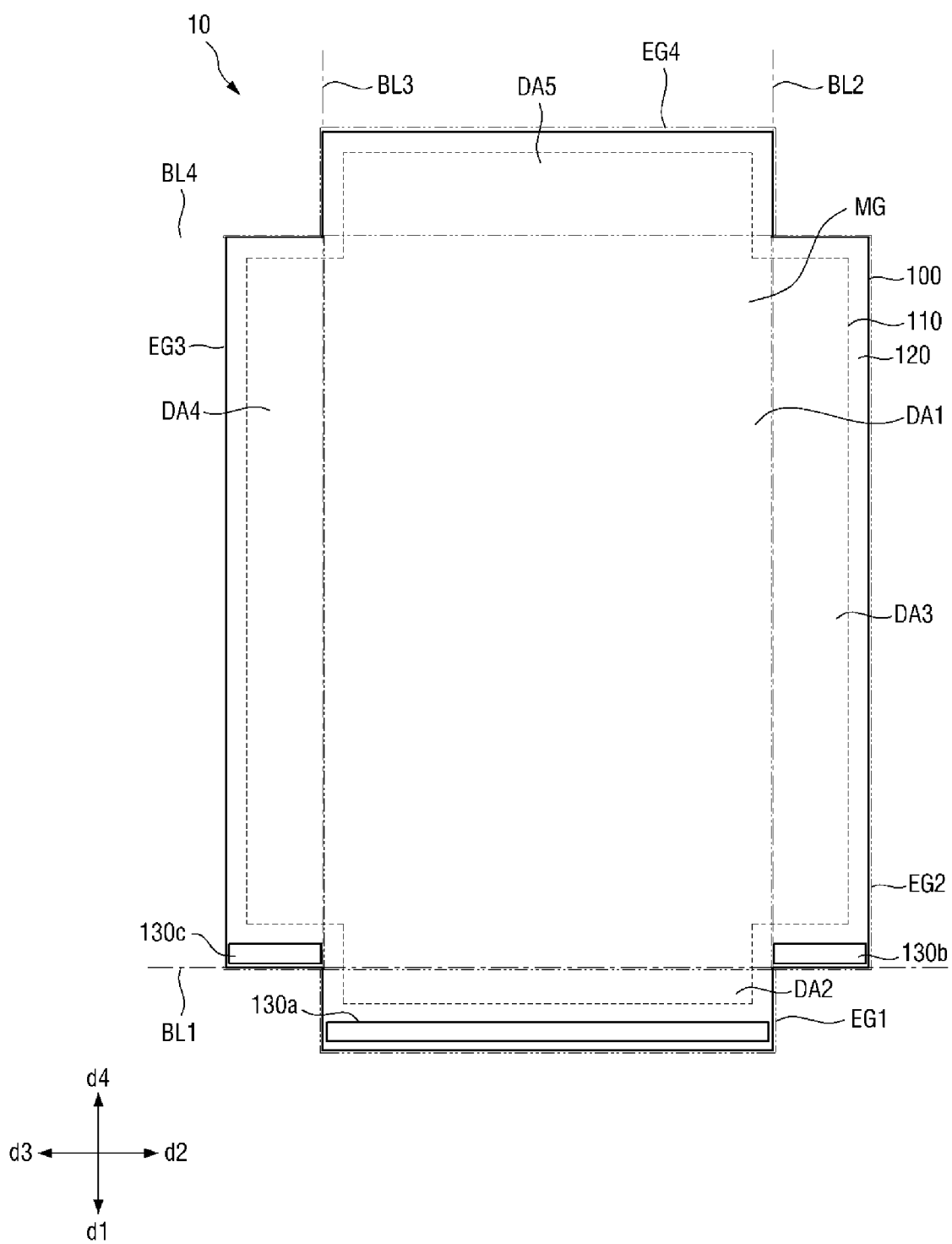
FIG. 5A illustrates a substrate in a state of not being bent.
Figure 5B:
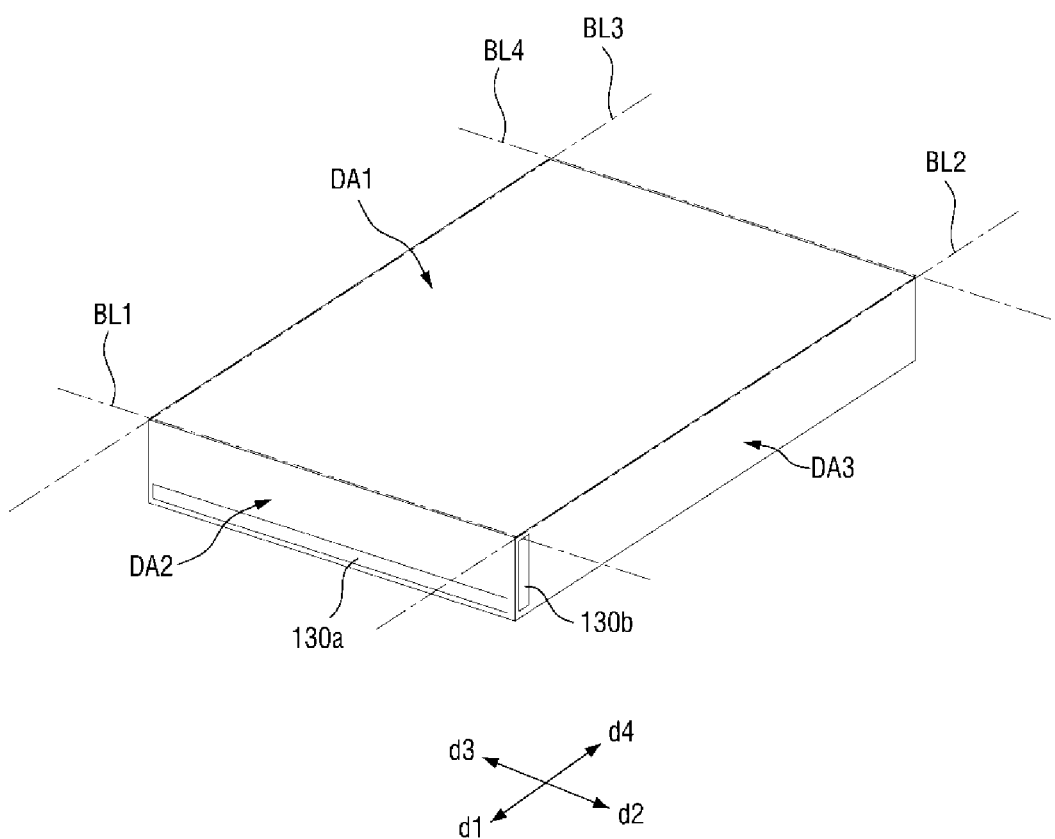
FIG. 5B illustrates the substrate of FIG. 5A in a state of being bent along bending lines.

FIG. 5A illustrates a substrate in a state of not being bent; and FIG. 5B illustrates the substrate in a state of being bent along bending lines.

As described above, the first through fourth edge areas EG1 through EG4 of the substrate 100 may be bent toward the rear of the main area MG along the first through fourth bending lines BL1 through BL4.

The first data pad portion 130a is disposed in the first edge area EG1, and the second data pad portion 130b is disposed in the second edge area EG2. Although not specifically illustrated in FIG. 5B, the third data pad portion 130c is disposed in the third edge area EG3. The first and second data pad portions 130a and 130b may not be placed in contact with each other. That is, on the substrate 100, the first through third data pad portions 130a through 130c may be isolated or spaced apart from one another and may be located in different areas.

The bent state of the flexible film 200 will be described with reference to FIGS. 6A and 6B.

Figure 6A:
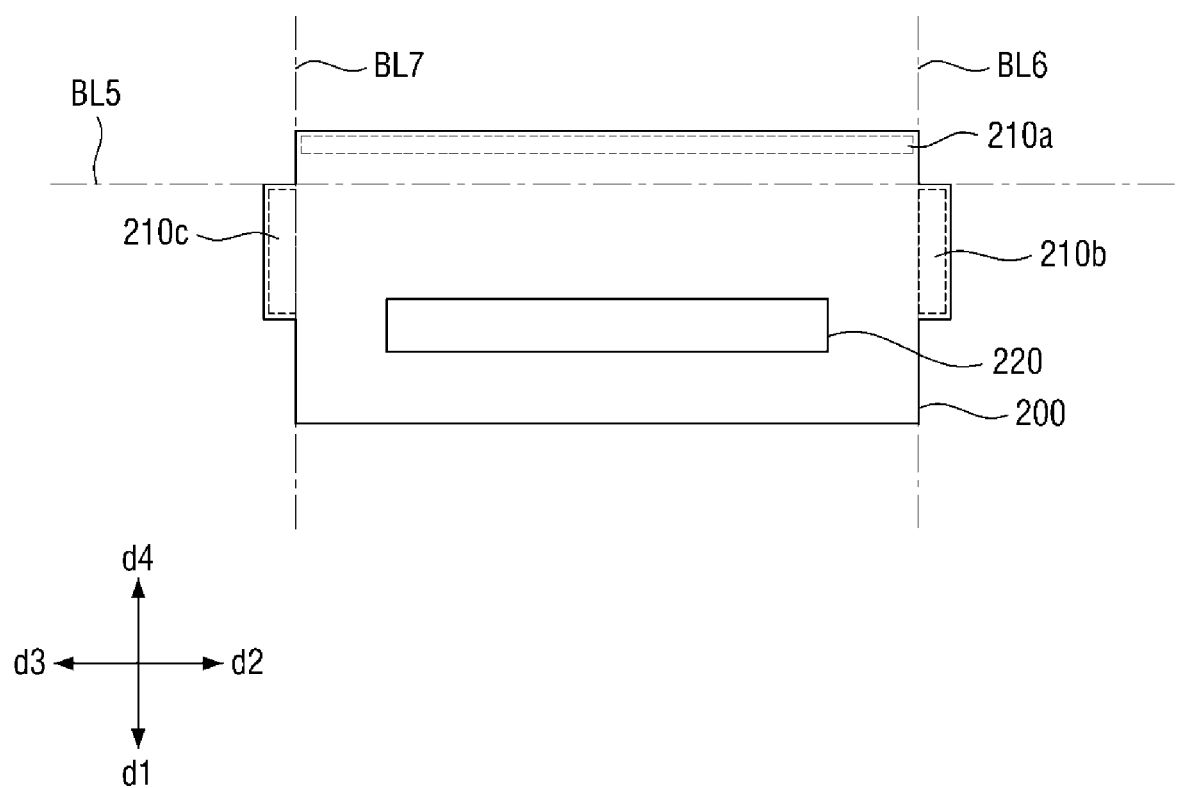
FIG. 6A illustrates a flexible film in a state of not being bent.
Figure 6B:
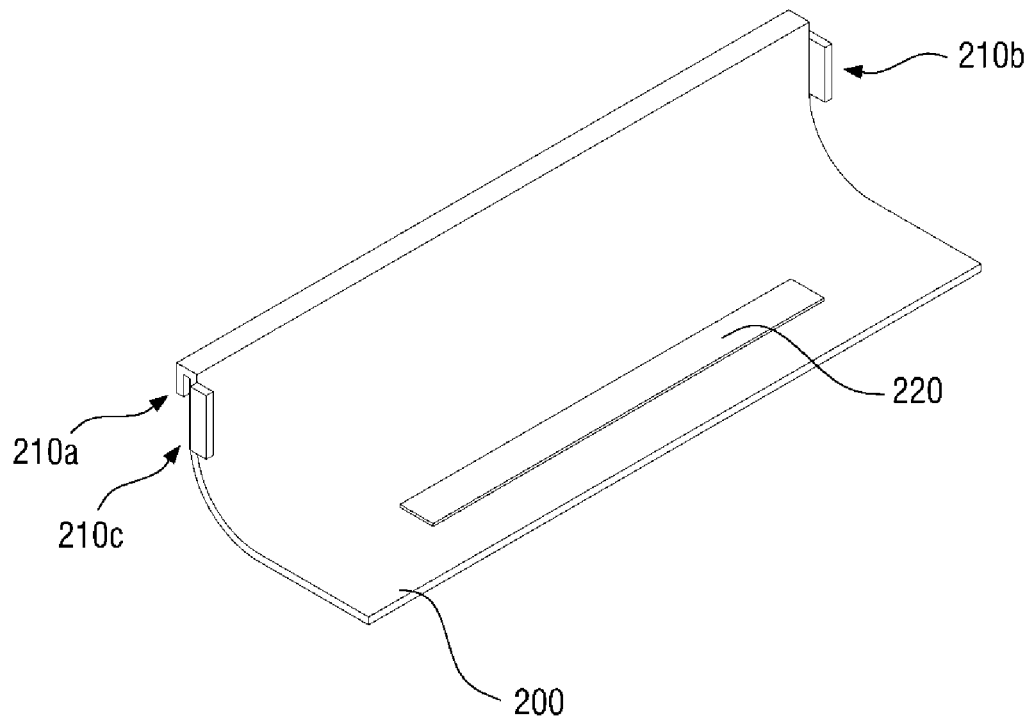
FIG. 6B illustrates the flexible film of FIG. 6A in a state of being bent along a bending line.

FIG. 6A illustrates a flexible film in a state of not being bent; and FIG. 6B illustrates the flexible film in a state of being bent along a bending line.

Referring to FIGS. 6A and 6B, the flexible film 200 may include the first through third signal pad portions 210a through 210c. The first signal pad portion 210a may be bent toward a rear surface of the flexible film 200 along a fifth bending line BL5, which extends in the second direction d2. The second and third signal pad portions 210b and 210c may be bent toward a front surface of the flexible film 200 along sixth and seventh bending lines BL6 and BL7, respectively, which extend in the first direction d1. That is, on the substrate 100, the first through third signal pad portions 210a through 210c may be isolated or spaced apart from one another and may be located in different areas.

Figure 7A:
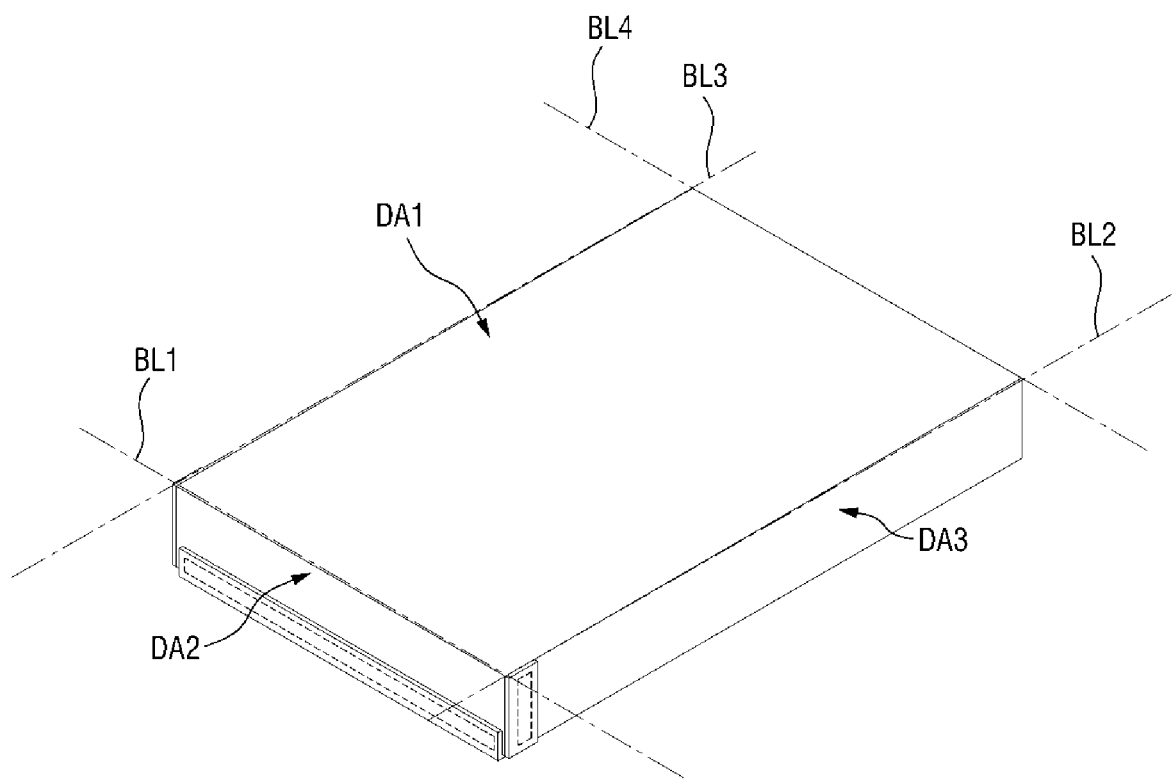
FIG. 7A is a perspective view illustrating a substrate and a flexible film in a state of being coupled together.
Figure 7A:
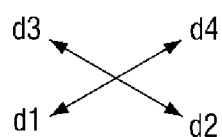
Figure 7B:
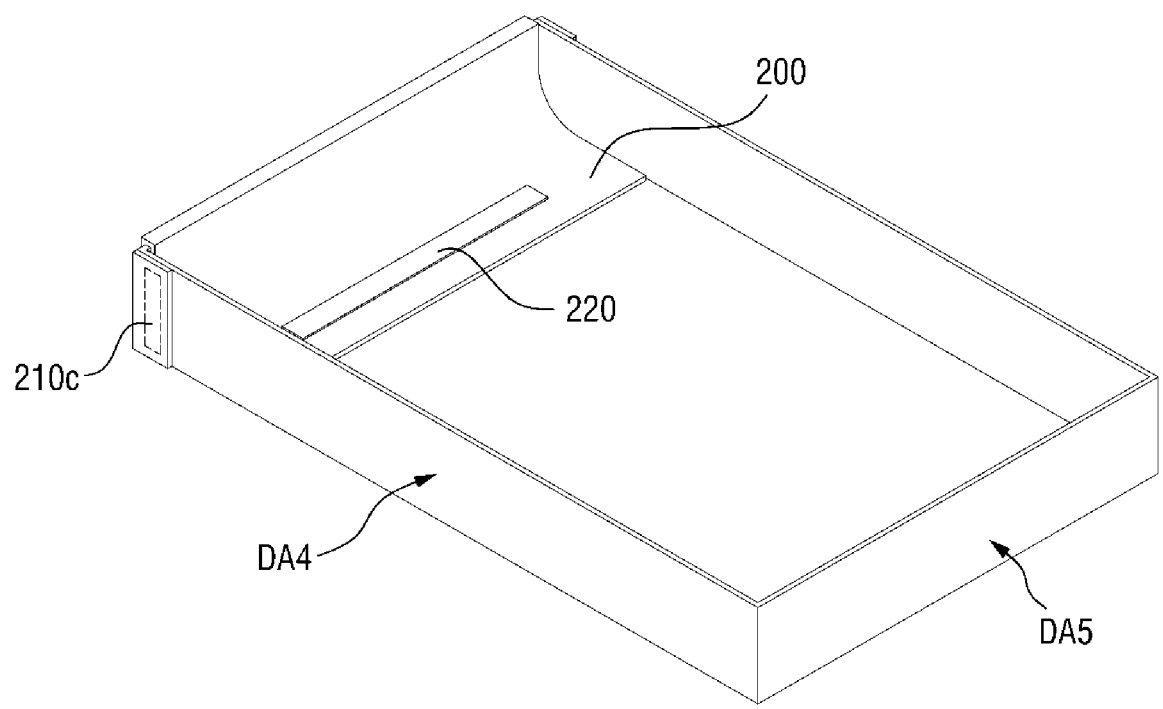
FIG. 7B is a rear perspective view illustrating the substrate and the flexible film of FIG. 7A in a state of being coupled together.

FIG. 7A is a perspective view illustrating a substrate and a flexible film in a state of being coupled together; and FIG. 7B is a rear perspective view illustrating the substrate and the flexible film in a state of being coupled together.

Referring to FIGS. 7A and 7B, the first signal pad portion 210a may be bent to surround part of the first edge area EG1 and may be placed in contact with the first data pad portion 130a. The second signal pad portion 210b may be bent to surround part of the second edge area EG2 and may be placed in contact with the second data pad portion 130b. The third signal pad portion 210c may be bent to surround part of the third edge area EG3 and may be placed in contact with the third data pad portion 130b. Here, a method in which the first through third signal pad portions 210a through 210c are connected to the first through third data pad portions 130a through 130c, respectively, is not particularly limited.

That is, since the first through third signal pad portions 210a through 210c are isolated or spaced apart from one another, the first through third signal pad portions 210a through 210c may be placed in contact with the first through third data pad portions 130a through 130c, respectively, independently of one another. In an exemplary embodiment, the flexible film 200 may be disposed on a rear surface of the substrate 100. The arrangement of the flexible film 200 on the rear surface of the substrate 100 is not particularly limited as long as the first through third signal pad portions 210a through 210c are placed in contact with the first through third data pad portions 130a through 130c, respectively, independently of one another.

Accordingly, the signal lines connected to the pixel units PX disposed in the third and fourth display areas DA3 and DA4 may not be arranged on both sides, in a longitudinal direction, of the first edge area EG1 (i.e. on both sides of the first edge area EG1 in the second and third directions d2 and d3). As a result, the area of the second display portion DA2, which is disposed in the first edge area EG1, can be increased. This will be described in further detail with reference to FIG. 8.

Figure 8:
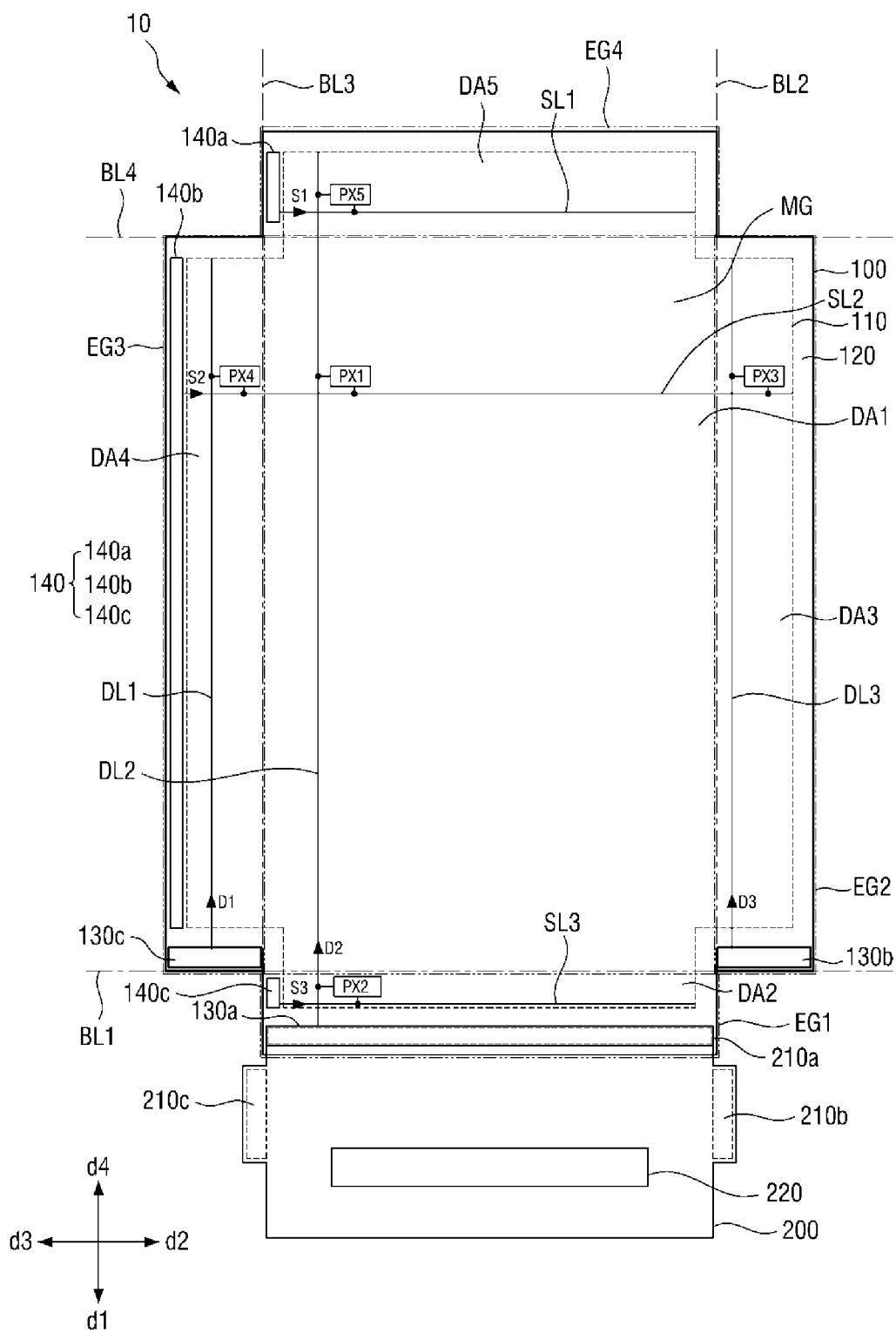
FIG. 8 is a plan view illustrating an arrangement of pixel units and signal lines, connected to the pixel units, in a flexible display device according to an exemplary embodiment of the present disclosure.

FIG. 8 is a plan view illustrating an arrangement of pixel units and signal lines, connected to the pixel units, in a flexible display device according to an exemplary embodiment of the present disclosure.

The arrangement of the pixel units PX and signal lines in the flexible display device according to an exemplary embodiment of the present disclosure will be described, taking first through fifth pixel units PX1 through PX5, first through third data lines DL1 through DL3, and first through third scan lines SL1 through SL3. The first through fifth pixel units PX1 through PX5 may have a same structure but have different locations. Although the terms "first," "second," and "third" are used herein to describe data lines and scan lines, the data lines and the scan lines are not limited by these terms. Also, as used herein, the expression "a pixel unit electrically connected to a data line or a scan line" means that a transistor included in the pixel unit, particularly, the scan transistor ST (see FIG. 3) of the pixel unit, is electrically connected to the data line or the scan line.

First, the first through third data lines DL1 through DL3 will be described.

The first pixel unit PX1 may be disposed in the first display portion DA1, which is disposed in the main area MG. The first pixel unit PX1 is electrically connected to the second data line DL2. The second pixel unit PX2, which is disposed in the second display portion DA2 in the first edge area EG1, and the fifth pixel unit PX5, which is disposed in the fifth display portion DA5 in the fourth edge area EG4, may also be electrically connected to the second data line DL2.

The second data line DL2 may be connected to at least one data pad included in the first data pad portion 130a. The first data pad portion 130a is directly connected to the first signal pad portion 210a, which is formed on the flexible film 200. Accordingly, a second data signal D2, which is output from the driver IC 220, may be provided to the second data line DL2 via the first signal pad portion 210a and the first data pad portion 130a. The first, second, and fifth pixel units PX1, PX2, and PX5 may be provided with the second data signal D2 via the second data line DL2.

The third pixel unit PX3 may be disposed in the third display portion DA3, which is disposed in the second edge area EG2. The third pixel unit PX3 is electrically connected to the third data line DL3.

The third data line DL3 may be connected to at least one data pad included in the second data pad portion 130b. The second data pad portion 130b is directly connected to the second signal pad portion 210b, which is formed on the flexible film 200. Accordingly, a third data signal D3, which is output from the driver IC 220, may be provided to the third data line DL3 via the second signal pad portion 210b and the second data pad portion 130b. The third pixel unit PX3 may be provided with the third data signal D3 via the third data line DL3.

The fourth pixel unit PX4 may be disposed in the fourth display portion DA4, which is disposed in the third edge area EG3. The fourth pixel unit PX4 is electrically connected to the first data line DL1.

The first data line DL1 may be connected to at least one data pad included in the third data pad portion 130c. The third data pad portion 130c is directly connected to the third signal pad portion 210c, which is formed on the flexible film 200. Accordingly, a first data signal D1, which is output from the driver IC 220, may be provided to the first data line DL1 via the third signal pad portion 210c and the third data pad portion 130c. The fourth pixel unit PX4 may be provided with the first data signal D1 via the first data line DL1.

That is, the pixel units PX disposed in the third display portion DA3 including the third pixel unit PX3 may receive data signals via the second data pad portion 130b, which is disposed in the second edge area EG2. Also, the pixel units PX disposed in the fourth display portion DA4 including the fourth pixel unit PX4 may receive data signals via the third data pad portion 130c, which is disposed in the third edge area EG3.

If there are no data pad portions in the second and third edge areas EG2 and EG3, additional signal lines for providing a plurality of data signals to the pixel units PX disposed in each of the third and fourth display portions DA3 and DA4 may be needed. Since the additional signal lines are covered by, for example, a black matrix, an additional space for forming the black matrix is needed in the first edge area EG1.

On the other hand, in the flexible display device 10 according to the present disclosure, the second and third data pad portions 130b and 130c are disposed in the second and third edge areas EG2 and EG3, respectively. Accordingly, the pixel units PX disposed in each of the third and fourth display portions DA3 and DA4 may receive data signals directly from the second or third data pad portion 130b or 130c. Thus, the additional signal lines and the black matrix for covering the additional signal lines are not needed.

Next, the first through third scan lines SL1 through SL3 will be described.

The scan driver 140 may include first through third sub-scan drivers 140a through 140c. The first sub-scan driver 140a may be disposed in the fourth edge area EG4. The second sub-scan driver 140b may be disposed in the third edge area EG3. The third sub-scan driver 140c may be disposed in the first edge area EG1.

The first sub-scan driver 140a may provide a first scan signal S1 to the fifth pixel unit PX5, which is disposed in the fifth display portion DA5, via the first scan line SL1. The second sub-scan driver 140b may provide a second scan signal S2 to the first, third, and fourth pixel units PX1, PX3, and PX4, which are disposed in the first, third, and fourth display portions DA1, DA3, and DA4, respectively, via the second scan line SL2. The third sub-scan driver 140c may provide a third scan signal S3 to the second pixel unit PX2, which is disposed in the second display portion DA2, via the third scan line SL3.

The third sub-scan driver 140c may generate the third scan signal S3 using a first control signal provided from the first data pad portion 130a. For this, an additional signal line for transmitting the first control signal may be disposed in the first edge area EG1. That is, control signals provided by the driver IC 220 may be transmitted to the third sub-scan driver 140c via the first signal pad portion 210a and the first data pad portion 130a, which is disposed in the first edge area EG1.

Also, the first and second sub-scan drivers 140a and 140b may generate the first and second scan signals S1 and S2, respectively, using a second control signal provided from the third data pad portion 130c. For this, an additional signal line for transmitting the second control signal may be disposed in the third edge area EG3. Also, a signal line for connecting the first and second sub-scan drivers 140a and 140b may be further disposed in the third and fourth edge areas EG3 and EG4.

That is, control signals provided by the driver IC 220 may be transmitted to the first and second sub-scan drivers 140a and 140b via the third signal pad portion 210c and the third data pad portion 130c, which is disposed in the third edge area EG3. The first sub-scan driver 140a may receive the second control signal from the third data pad portion 130c either directly or indirectly via an additional signal line connected to the second sub-scan driver 140b.

That is, since the first and second sub-scan drivers 140a and 140b can receive the second control signal from the third data pad portion 130c, a plurality of signal lines for connecting the second and third sub-scan drivers 140b and 140c may not be disposed in the first edge area EG1. Accordingly, the area of the second display portion DA2 of the first edge area EG1 can be increased.

Although not specifically illustrated, an emission controller and a plurality of emission control lines connected to the emission controller may be further disposed on the substrate 100. In an exemplary embodiment, the emission controller may be disposed in the first, second, and fourth edge areas EG1, EG2, and EG4 and may provide emission control signals to the pixel units PX, which are disposed in the first through fifth display portions DA1 through DA5. The emission control signals are signals for controlling the emission duration of each of the pixel units PX. For this, each of the pixel units PX may further include at least one emission control transistor, which is provided with an emission control signal.

That is, even the emission controller may receive control signals for providing the emission control signals to the pixel units PX disposed in each of the first, third, fourth, and fifth display portions DA1, DA3, DA4, and DA5, directly from the second data pad portion 130b.

The first through third data pad portions 130a through 130c may be connected even to the driving voltage lines, which are for providing the first and second driving voltages ELVDD and ELVSS, via the first through third signal pad portions 210a through 210c. Accordingly, in a case in which the driving voltage lines are disposed in the second through fourth edge areas EG2 through EG4, the driving voltage lines may receive the first and second driving voltages ELVDD and ELVSS directly from the second and third data pad portions 130b and 130c.

In another exemplary embodiment, the first through third data pad portions 130a through 130c may be connected even to an inspection line for checking whether there is any abnormal signal output or an initialization line for providing an initialization voltage.

That is, since in the flexible display device 10, the second and third data pad portions 130b and 130c are disposed in, and placed in contact with, the second and third edge areas EG2 and EG3, respectively, the number of additional connection lines for transmitting signals can be minimized or reduced. As a result, the area of the second display portion DA2, which is disposed in the first edge area EG1, can be increased.

Flexible display devices according to some other exemplary embodiments of the present disclosure will be described below, omitting any redundant descriptions of elements that have already been described above with reference to FIGS. 1 through 8.

Figure 9:
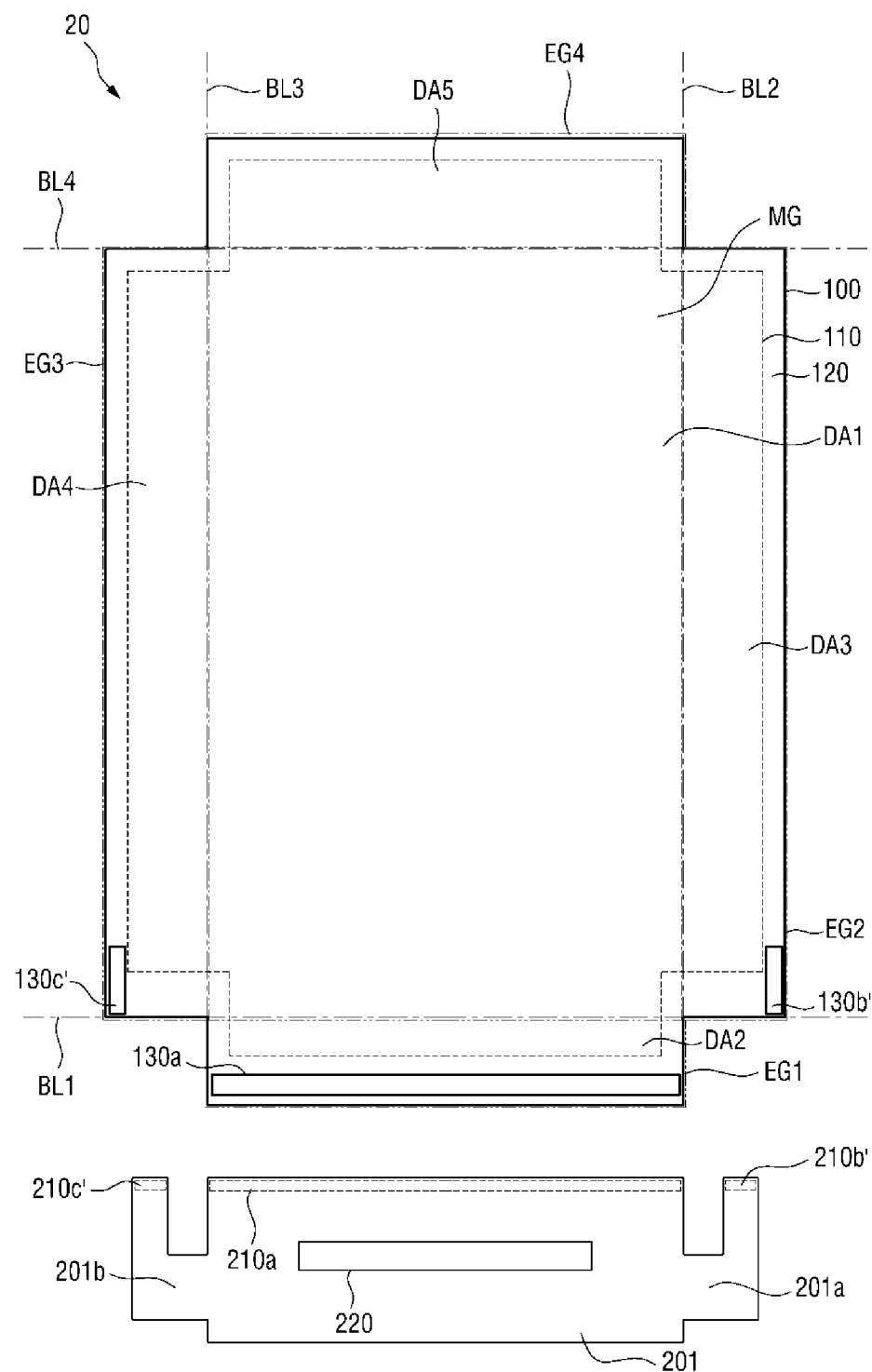
FIGS. 9 and 10 are plan views illustrating flexible display devices according to some other exemplary embodiments of the present disclosure.
Figure 10:
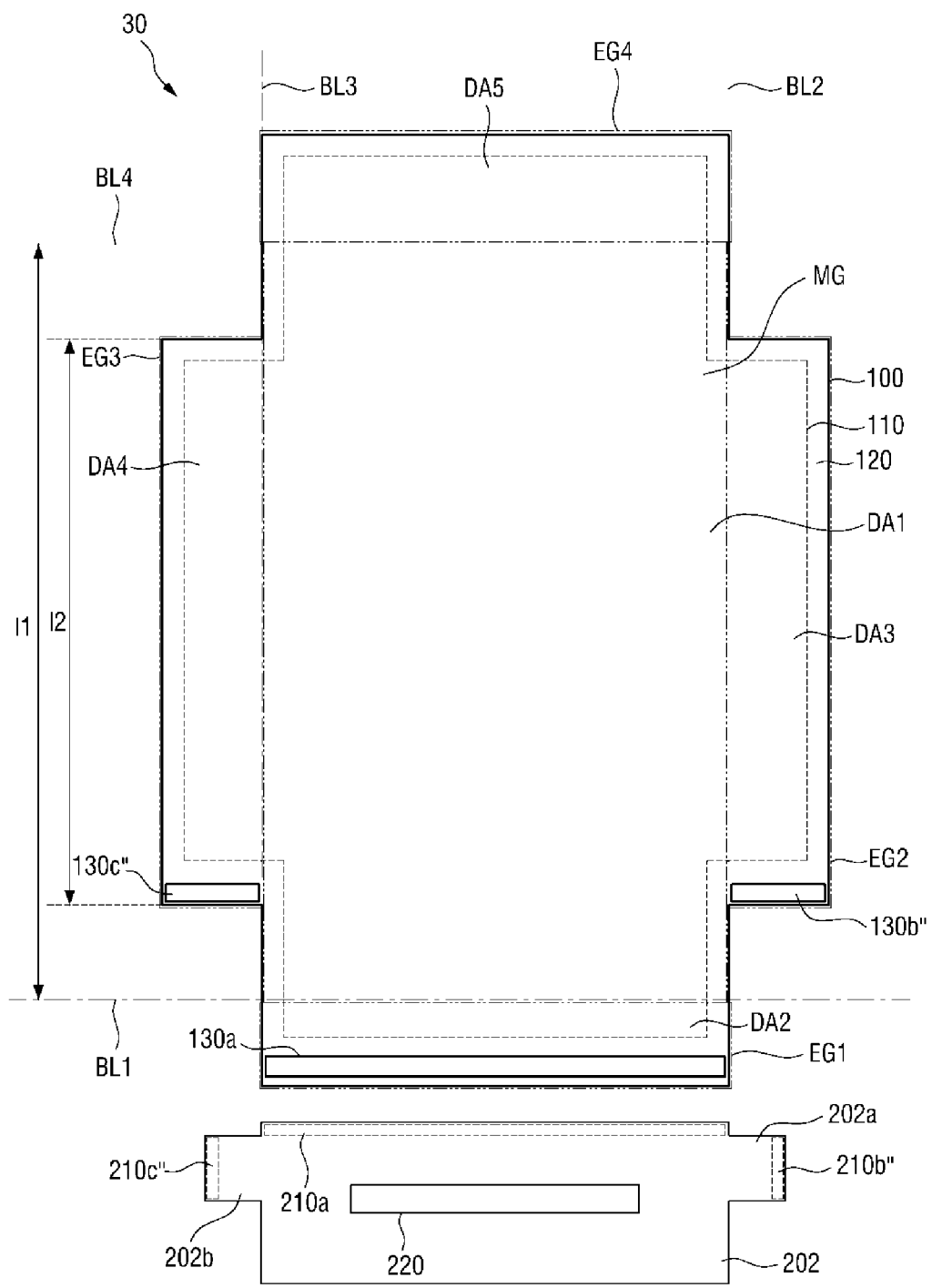

FIGS. 9 and 10 are plan views illustrating flexible display devices according to some other exemplary embodiments of the present disclosure.

A flexible display device 20 of FIG. 9 differs from the flexible display device 10 of FIG. 1 in an arrangement of second and third data pad portions 130b' and 130c', a shape of a flexible film 201, and an arrangement of second and third signal pad portions 210b' and 210c'.

Referring to FIG. 9, the second and third data pad portions 130b' and 130c' may be disposed along a first direction d1. Accordingly, the direction in which second and third signal pad portions 210b' and 210c', which are placed in direct contact with the second and third data pad portions 130b' and 130c', respectively, extend may differ from the direction in which the second and third signal pad portions 210b and 210c of FIG. 1 extend. In an embodiment, the second signal pad portion 210b' may be formed at a first tail portion 201a of the flexible film 201, and the third signal pad portion 210c' may be formed at a second tail portion 201b of the flexible film 201. In an exemplary embodiment, the first and second tail portions 201a and 201b may be symmetrical with each other.

The shape of the flexible film 201 and the arrangement of the flexible film 201 on the rear surface of a substrate 100 are not particularly limited as long as the second and third data pad portions 130b' and 130c' are placed in direct contact with the second and third signal pad portions 210b' and 210c', respectively.

A flexible display device 30 of FIG. 10 differs from the flexible display device 10 of FIG. 1 in that a length l2 of second and third edge areas EG2 and EG3 is smaller than a length l1 of a main area MG. The flexible display device 30 of FIG. 10 also differs from the flexible display device 10 of FIG. 1 in the shape of a flexible film 202.

Referring to FIG. 10, the length l2 of the second and third edge areas EG2 and EG3 may be smaller than the length l1 of the main area MG. Accordingly, the flexible film 202 may include first and second tail portions 202a and 202b. A second signal pad portion 210b'', which is placed in direct contact with a second data pad portion 130b'' disposed in the second edge area EG2, may be formed at the first tail portion 202a. Also, a third signal pad portion 210c'', which is placed in direct contact with a third data pad portion 130c'' disposed in the third edge area EG3, may be formed at the second tail portion 202b.

That is, in a flexible display device according to some exemplary embodiments of the present disclosure, the shape of a flexible film and the locations of signal pad portions can be varied in consideration of the shape and length of edge areas and the direction in which data pad portions extend. In a case in which the data pad portions are placed in direct contact with the signal pad portions, the shape and length of the edge areas, the direction in which the data pad portions extend, the shape of the flexible film, and the locations of the signal pad portions are not limited to the exemplary embodiments of FIGS. 9 and 10.

While some exemplary embodiments of the present disclosure are described above, it is not intended that these embodiments describe all possible forms of the inventive concept of the present disclosure. Rather, terms used in the specification are terms of description rather than limitation, and it is to be understood that various changes may be made without departing from the spirit and scope of the inventive concept of the present disclosure. Additionally, features of various exemplary embodiments may be combined to form further exemplary embodiments of the present disclosure.

What is claimed is:

1. A flexible display device comprising:
   a substrate comprising: a main area; a first edge area arranged in a first direction with respect to the main area, a first data pad portion disposed in the first edge area; and a second edge area arranged in a second direction, which intersects the first direction, with respect to the main area, a second data pad portion disposed in the second edge area; and a flexible film on which first and second signal pad portions connected to the first and second data pad portions, respectively, are arranged, wherein the first edge area is bent along a first bending line, which extends in the second direction, and the second edge area is bent along a second bending line, which extends in the first direction.

2. The flexible display device of claim 1, further comprising:

a first pixel unit connected to a first data line disposed in the main area; and a second pixel unit connected to a second data line disposed in the second edge area, wherein the first data line is connected to the first data pad portion, and the second data line is connected to the second data pad portion.

3. The flexible display device of claim 1, wherein the first signal pad portion is connected directly to the first data pad portion, and the second signal pad portion is connected directly to the second data pad portion.

4. The flexible display device of claim 1, wherein the first data pad portion is not connected to the second data pad portion.

5. The flexible display device of claim 1, wherein the substrate further includes a third edge area arranged in a third direction, which is opposite the second direction, with respect to the main area, a third data pad portion being disposed in the third edge area, a third signal pad portion connected to the third data pad portion is further disposed on the flexible film, and the third edge area is bent along a third bending line, which extends in the first direction.

6. The flexible display device of claim 5, further comprising a third pixel unit connected to a third data line disposed in the third edge area, wherein the third data line is connected to the third data pad portion.

7. The flexible display device of claim 5, further comprising a scan driver disposed in the third edge area of the substrate, wherein the scan driver is connected to the third data portion.

8. The flexible display device of claim 5, wherein display portions to display an image are disposed in the main area and the first through third edge areas.

9. The flexible display device of claim 1, further comprising a driver integrated circuit on the flexible film, wherein the driver integrated circuit is connected to the first and second signal pad portions.

10. The flexible display device of claim 1, wherein the second data pad portion extends in the second direction.

11. The flexible display device of claim 1, wherein the second data pad portion extends in the first direction.

12. The flexible display device of claim 1, wherein the flexible film includes a tail portion extending in the second direction, and the second signal pad portion is arranged at the tail portion.

13. A flexible display device comprising:

a substrate comprising: a main area, a first pixel unit disposed in the main area; a first edge area arranged in a first direction with respect to the main area, a second pixel unit and a first data pad portion disposed in the first edge area; and a second edge area arranged in a second direction, which intersects the first direction, with respect to the main area, a third pixel unit and a second data pad portion disposed in the second edge area, wherein the first edge area is bent along a first bending line, which extends in the second direction, the second edge area is bent along a second bending line, which extends in the first direction, the third pixel unit includes a first switching element connected to a first data line arranged in the second edge area, and the first data line is connected to the second data pad portion.

14. The flexible display device of claim 13, further comprising a flexible film on which first and second signal pad portions connected to the first and second data pad portions, respectively, are arranged.

15. The flexible display device of claim 14, wherein the first signal pad portion is connected directly to the first data pad portion, and the second signal pad portion is connected directly to the second data pad portion.

16. The flexible display device of claim 14, further comprising a driver integrated circuit on the flexible film, wherein the driver integrated circuit is connected to the first and second signal pad portions.

17. The flexible display device of claim 14, wherein the flexible film includes a tail portion extending in the second direction, and the second signal pad portion is arranged at the tail portion.

18. The flexible display device of claim 13, wherein the second data pad portion extends in the first or second direction.

19. The flexible display device of claim 13, wherein the first data line is not connected to the first data pad portion.

20. The flexible display device of claim 13, wherein the substrate further includes a third edge area arranged in a third direction, which is opposite the second direction, with respect to the main area, a fourth pixel unit and a third data pad portion disposed in the third edge area, the third edge area is bent along a third bending line, which extends in the first direction, the fourth pixel unit includes a second switching element connected to a second data line disposed in the third edge area, and the second data line is connected to the third data pad portion.

* * * * *